United States Patent [19]

Mohsen

[11] Patent Number: 4,471,368
[45] Date of Patent: Sep. 11, 1984

[54] DYNAMIC RAM MEMORY AND VERTICAL CHARGE COUPLED DYNAMIC STORAGE CELL THEREFOR

[76] Inventor: Amr M. Mohsen, 10476 Soby Meadow Ct., Saratoga, Calif. 95070

[21] Appl. No.: 152,092

[22] Filed: May 21, 1980

Related U.S. Application Data

[63] Continuation of Ser. No. 841,735, Oct. 13, 1977, abandoned.

[51] Int. Cl.³ .................... H01L 29/78; H01L 27/10; G11C 11/34
[52] U.S. Cl. ....................................... 357/23; 357/24; 357/45; 365/183
[58] Field of Search ............................. 357/23, 24, 45; 307/238; 365/183

[56] References Cited

U.S. PATENT DOCUMENTS

| | | | |
|---|---|---|---|
| 3,676,715 | 7/1972 | Brojdo | 307/304 |
| 3,852,800 | 12/1974 | Ohwada et al. | 357/24 |
| 3,936,862 | 2/1976 | Moyle | 357/23 |
| 3,997,799 | 12/1976 | Baker | 357/24 |
| 4,000,504 | 12/1976 | Berger | 357/23 |
| 4,003,036 | 1/1977 | Jenne | 357/24 |
| 4,060,738 | 11/1977 | Tasch et al. | 357/24 |
| 4,062,037 | 12/1977 | Togei et al. | 357/24 |
| 4,135,289 | 1/1979 | Brews et al. | 357/23 C |
| 4,163,985 | 8/1979 | Schuermeyer et al. | 357/23 |

OTHER PUBLICATIONS

Grassl et al., "The 3T-CID Cell a Memory Cell for High Density Dynamic RAM's", IEEE Trans. Electron Devices, vol. ED-26, (6/79), pp. 865-870.
Koch et al., "Three-Terminal CID as Random Access Memory Cell", IEEE J. Solid-State Circuits, vol. SC-12, (10/77), pp. 534-536.
Baker, "CCD Array Forms Random-Access Memory", Electronics, (13 Nov. 1975), pp. 138-139.
Dockerty, "Writing Scheme for a CCD Random-Access Memory", IBM Technical Disclosure Bullentin, vol. 19, (2/76), p. 510.

*Primary Examiner*—Gene M. Munson
*Attorney, Agent, or Firm*—Lowe, King, Price & Becker

[57] ABSTRACT

A dynamic RAM memory comprised of a plurality of storage cells, each cell having its elements vertically stacked and using vertical charge coupling for charging and discharging the cell capacitor. The preferred embodiment of the cell comprises a semiconductive substrate having diffused into its upper surface a channel of opposite impurity concentration to that of the substrate for forming the bit line of the memory. An epitaxial layer is grown on the substrate surface to bury the bit line, a channel stop is diffused into the upper surface of the epitaxial layer to circumscribe the active cell area, and a thin insulator is disposed on the surface of the epitaxial layer with a conductive strip deposited thereon which form the word line of the memory. The thickness of the epitaxial layer, the impurity concentration of the buried channel and the epitaxial layer, together with the applied voltages, are selected for charge coupling operations.

10 Claims, 34 Drawing Figures

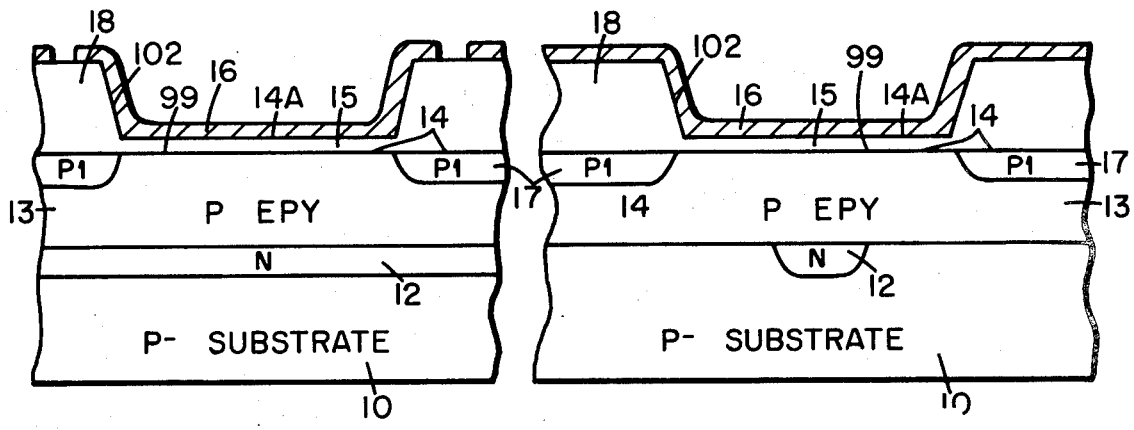
Fig_1A    Fig_1B
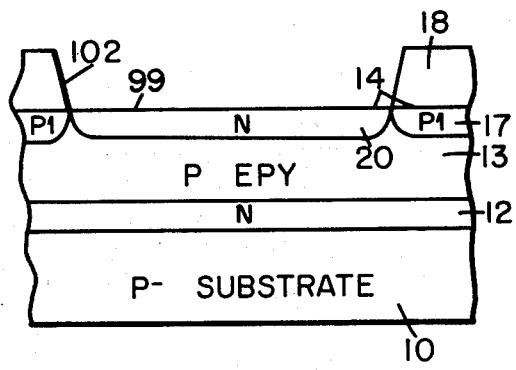
Fig_2A
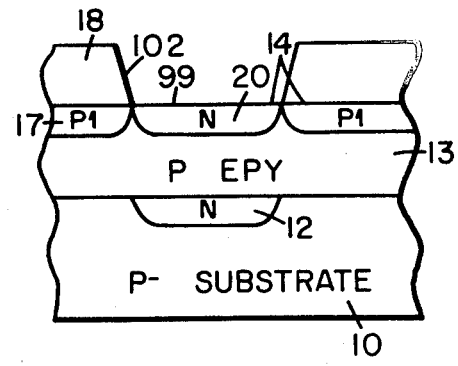
Fig_2B

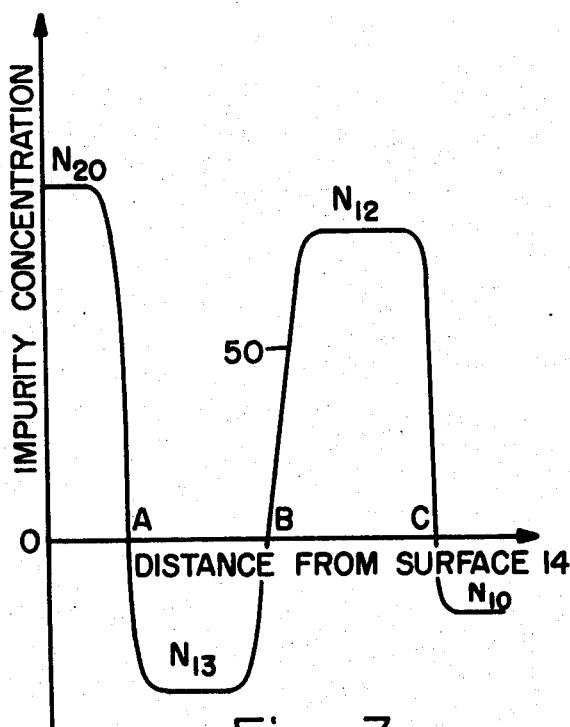
Fig_3
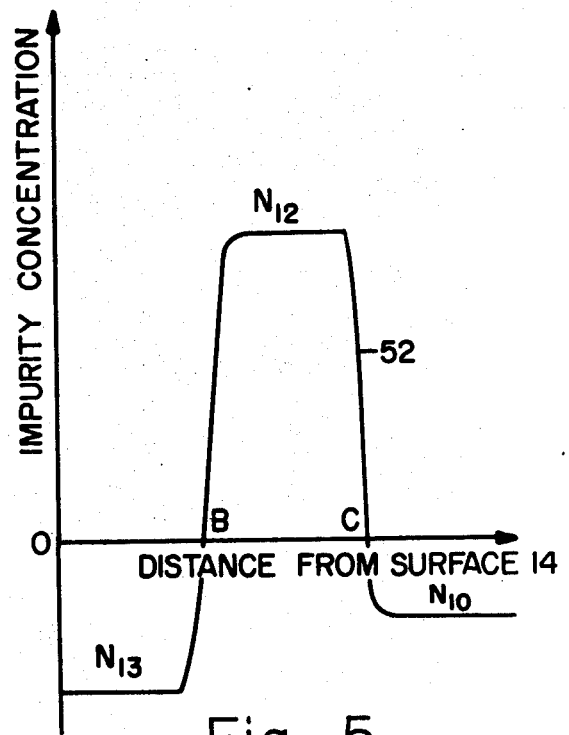
Fig_5
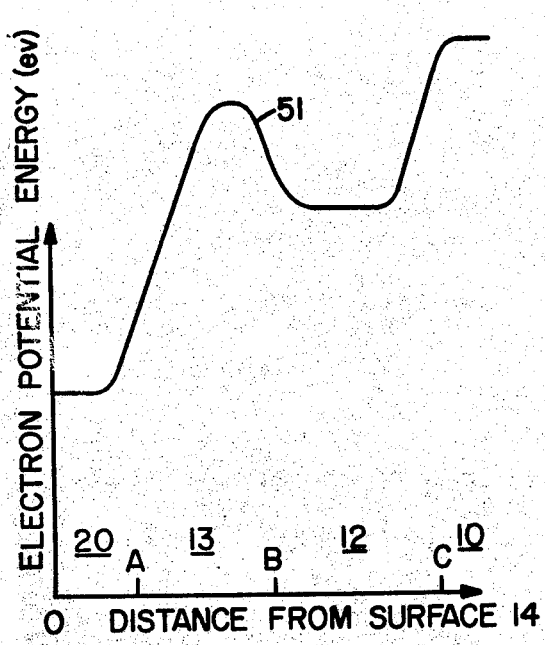
Fig_4
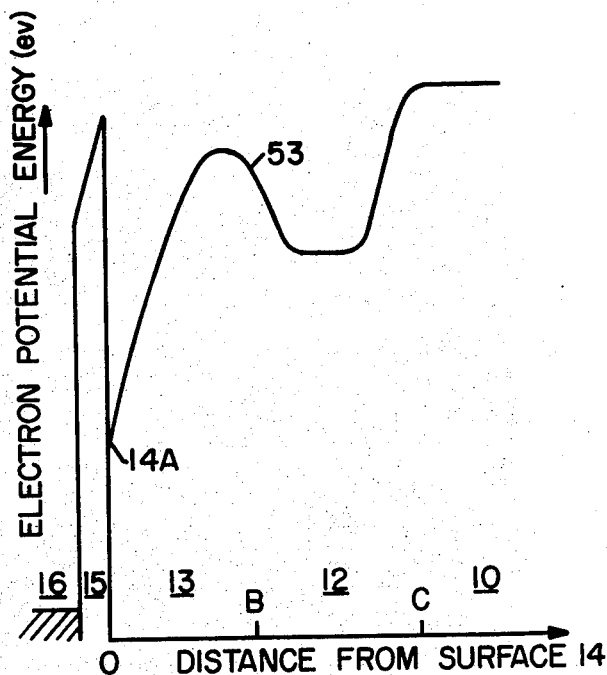
Fig_6

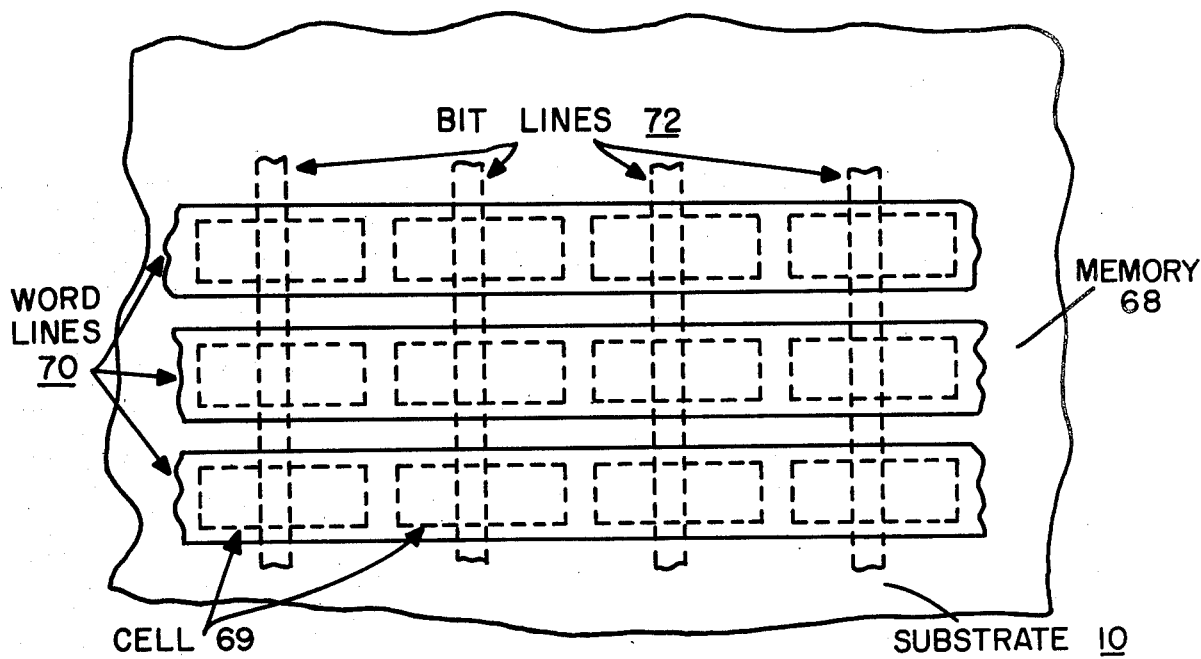
Fig_7
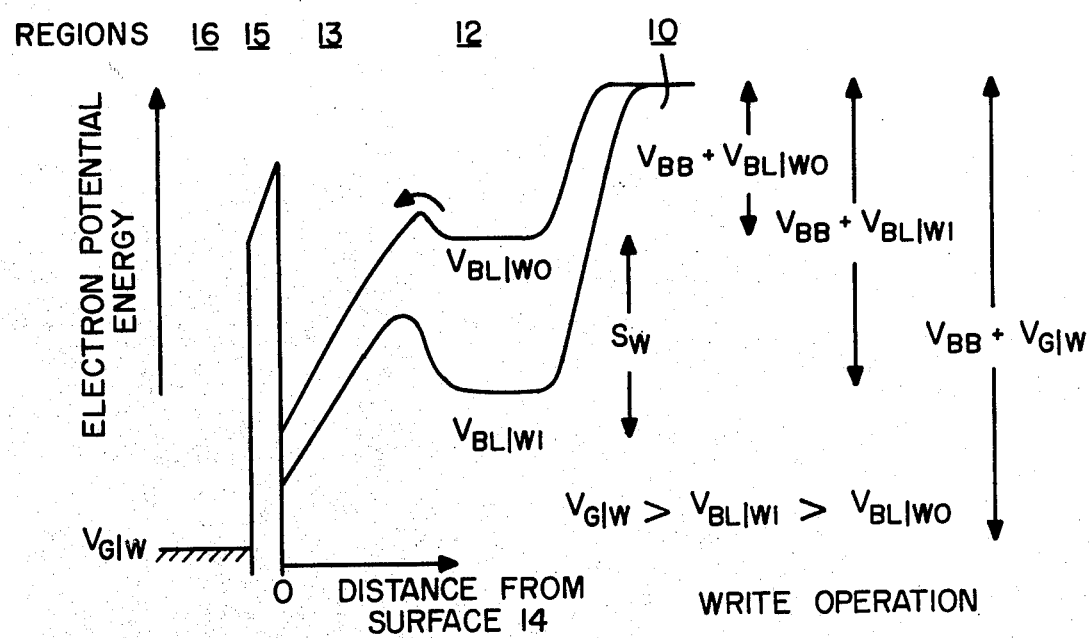
Fig_8A

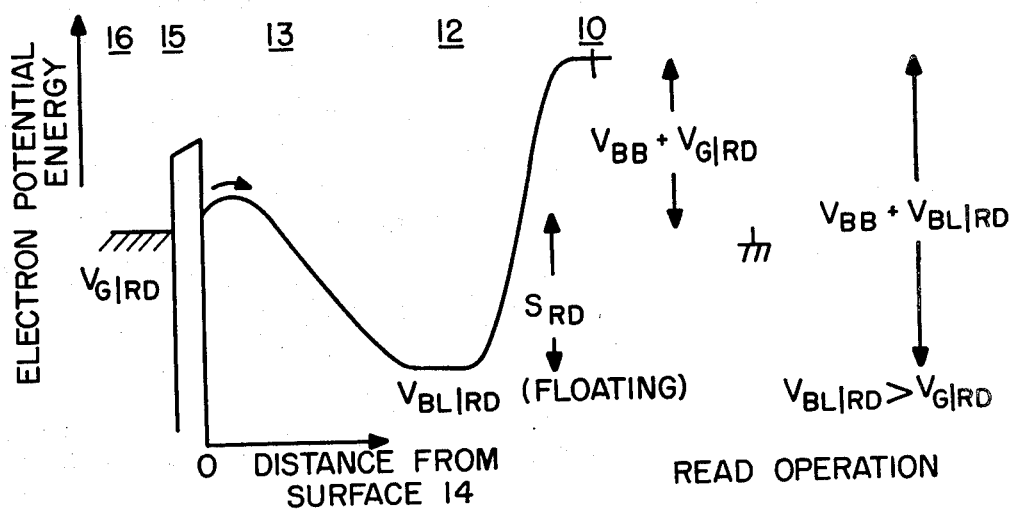
Fig_8B
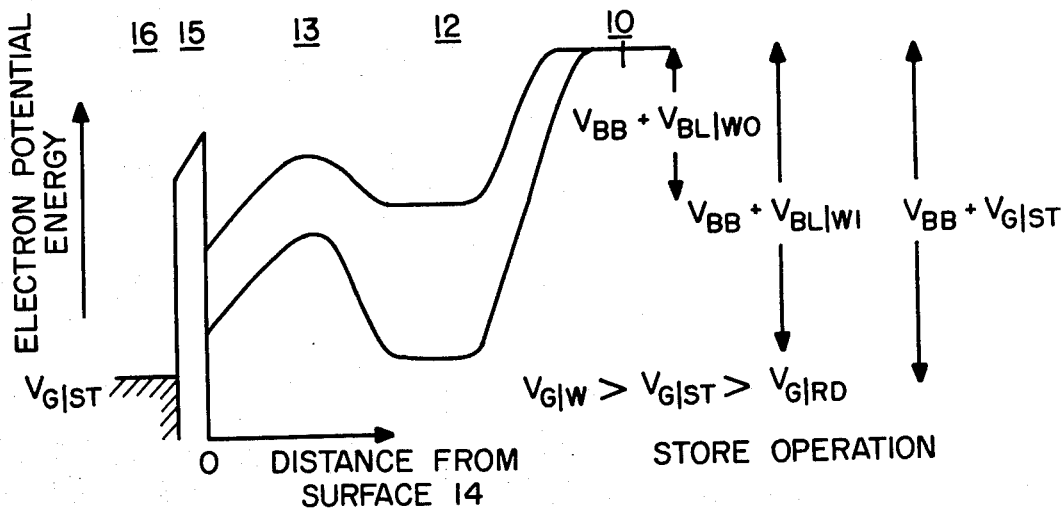
Fig_8C
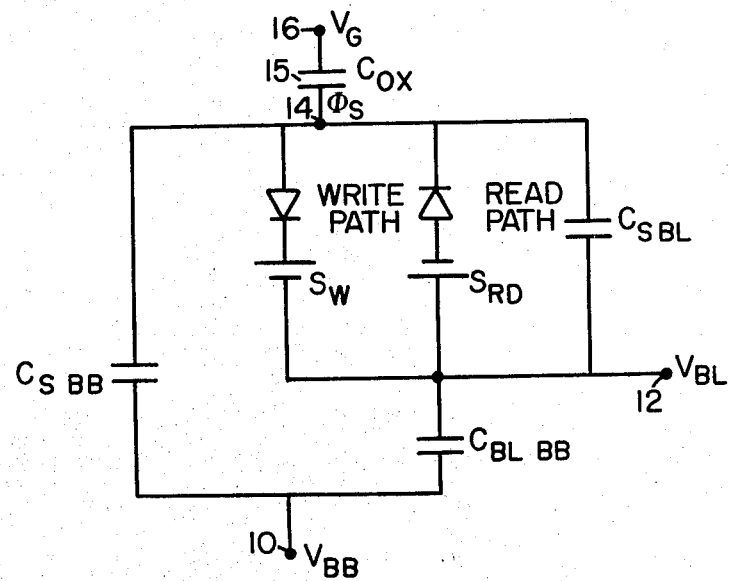
Fig_9

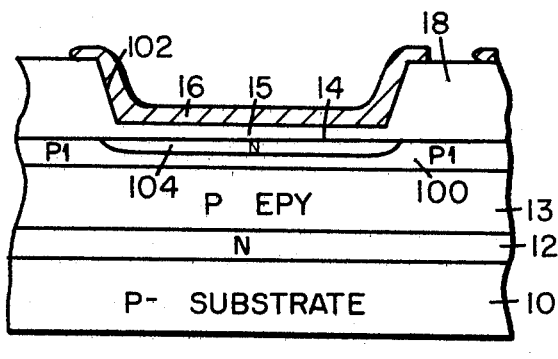
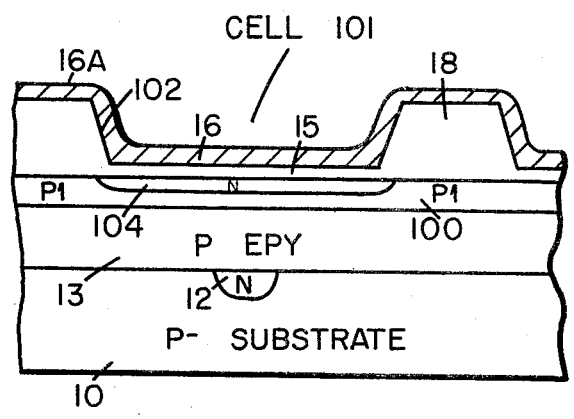
Fig_10A  Fig_10B
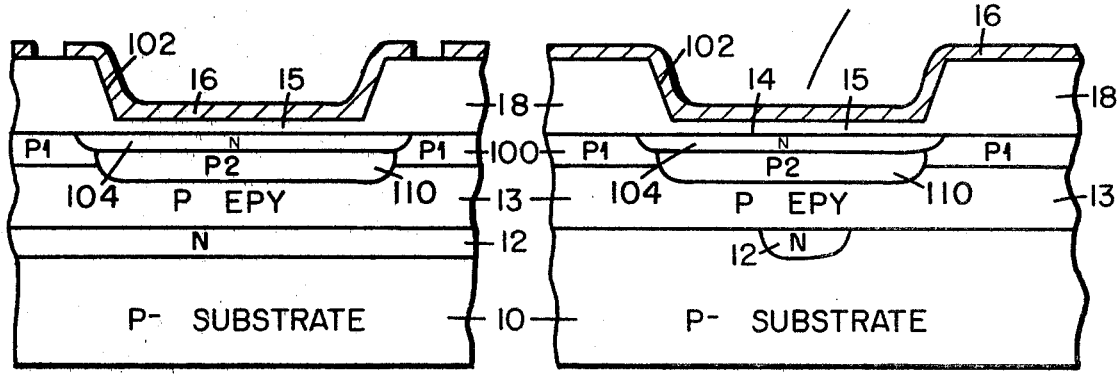
Fig_11A  Fig_11B

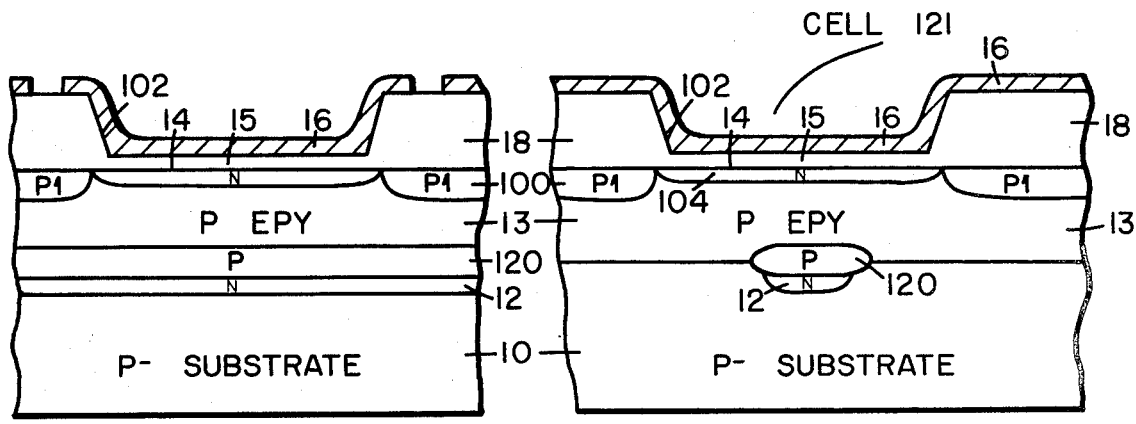
Fig_12A  Fig_12B
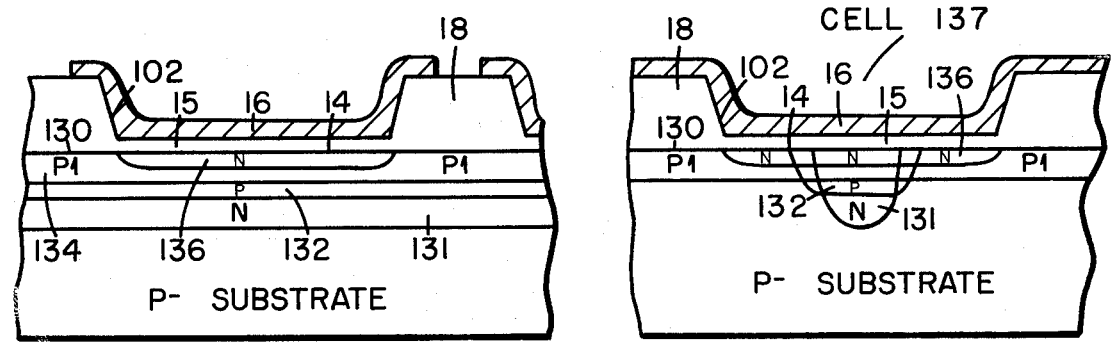
Fig_13A  Fig_13B

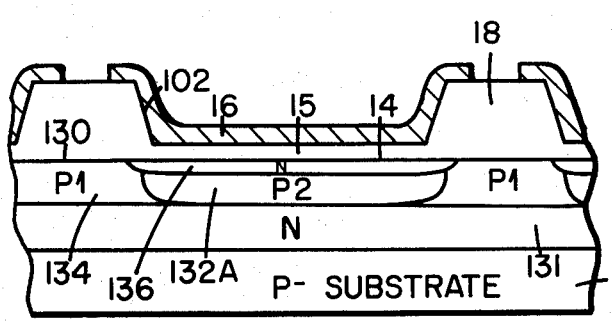
Fig_14A
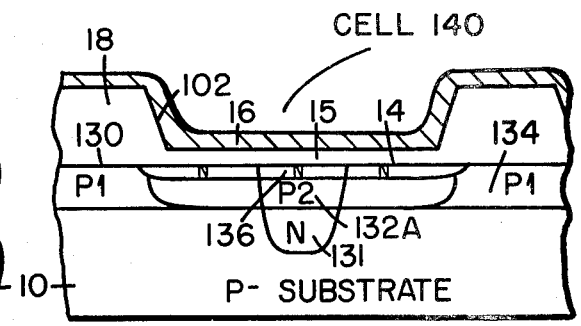
Fig_14B
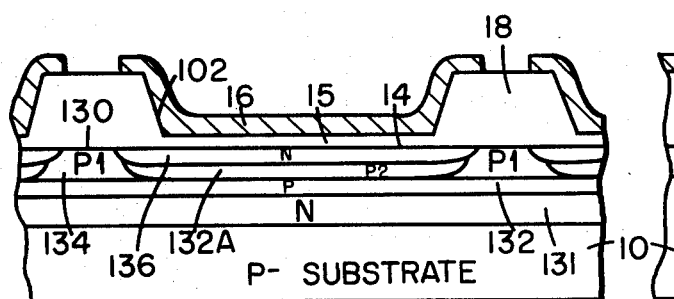
Fig_15A
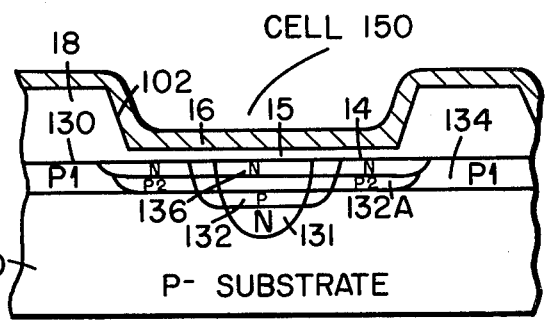
Fig_15B
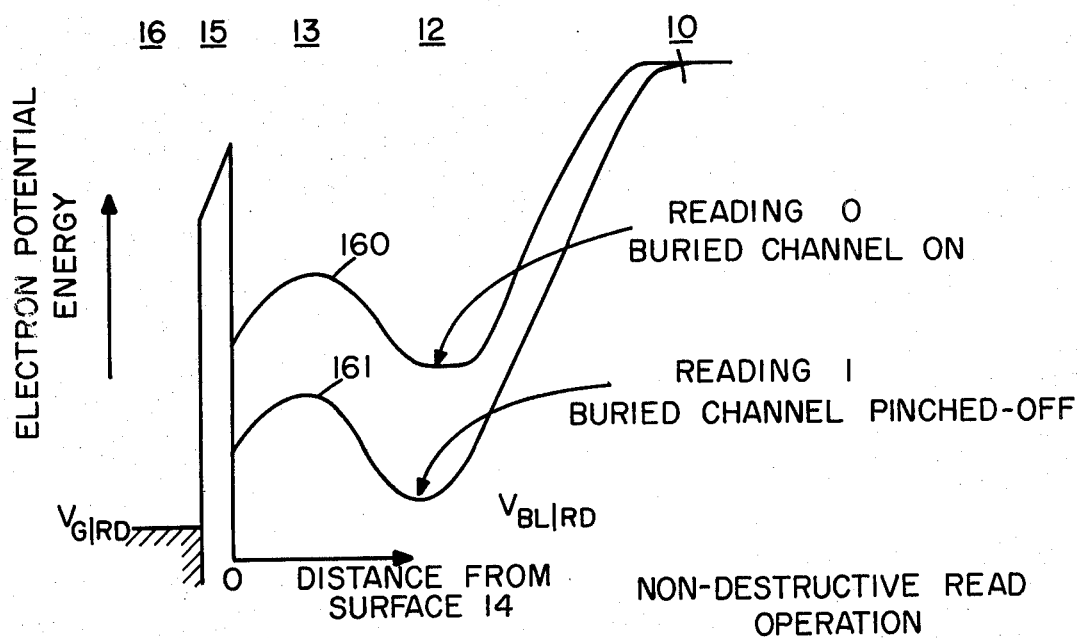
Fig_16

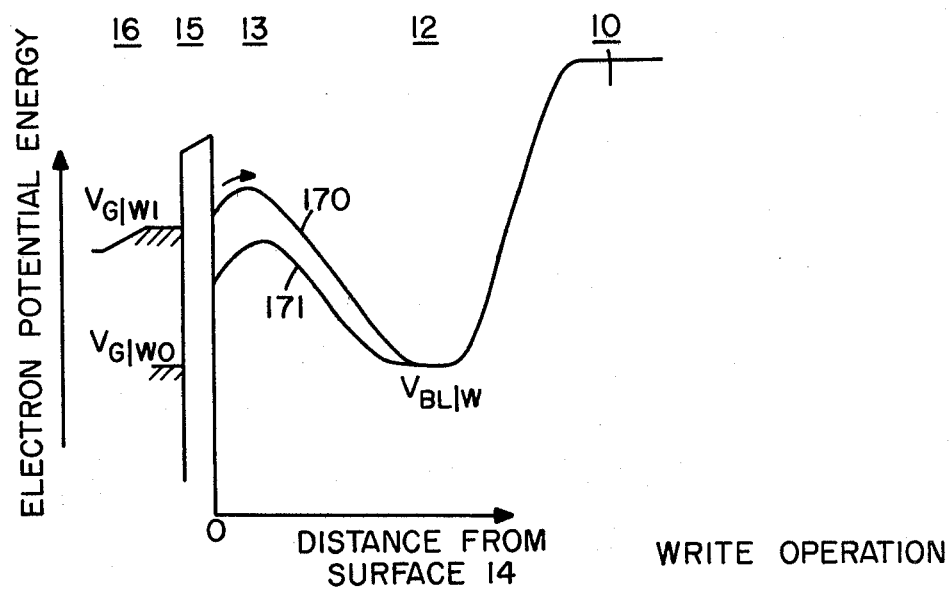
Fig_17A
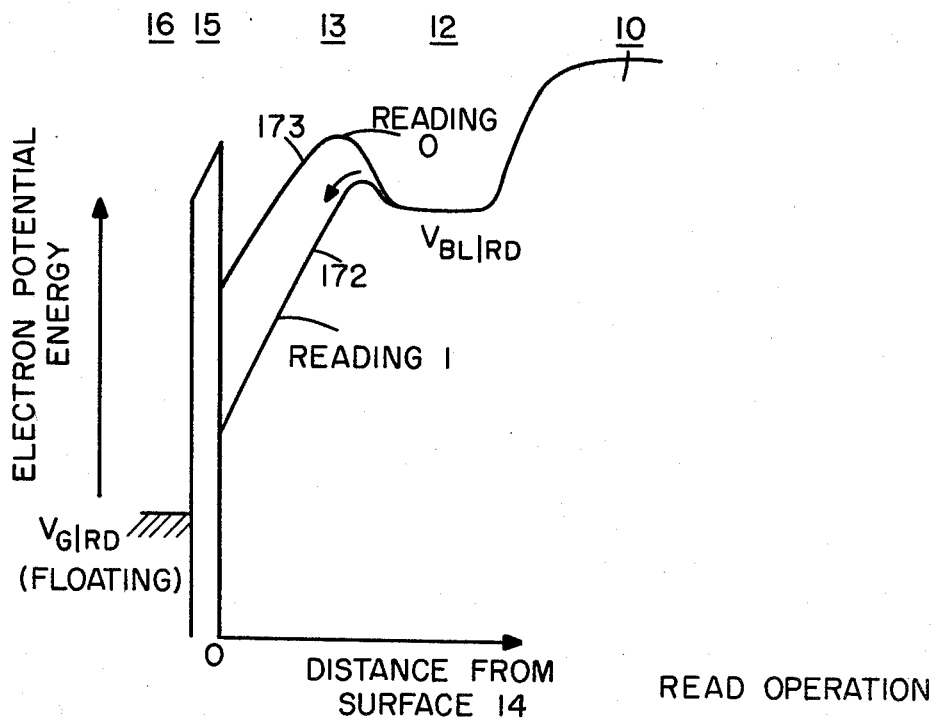
Fig_17B

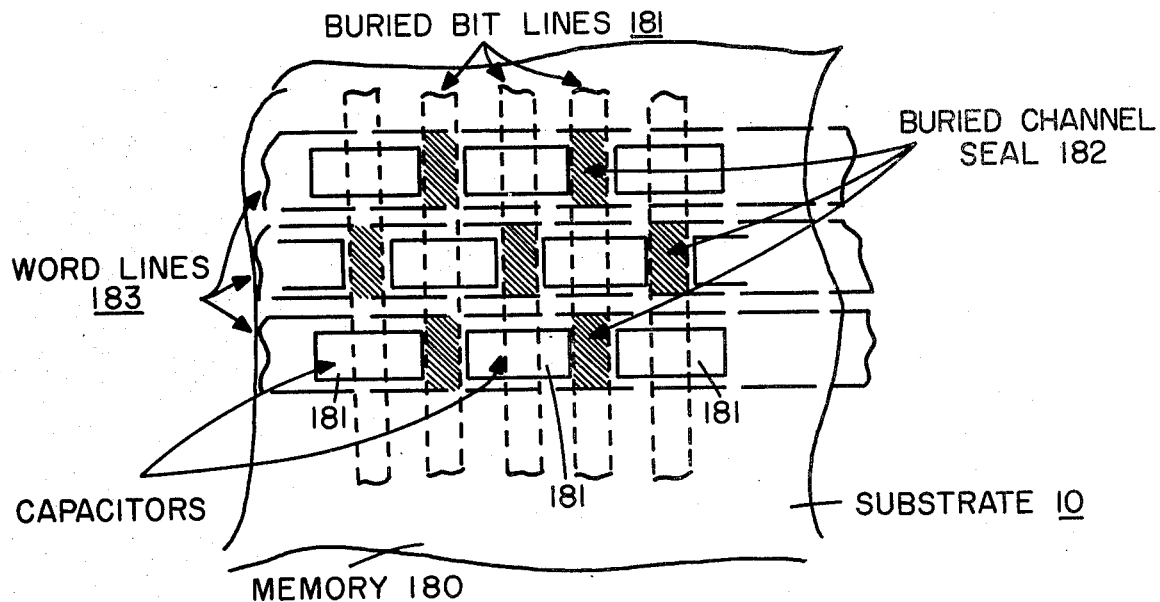
Fig_18
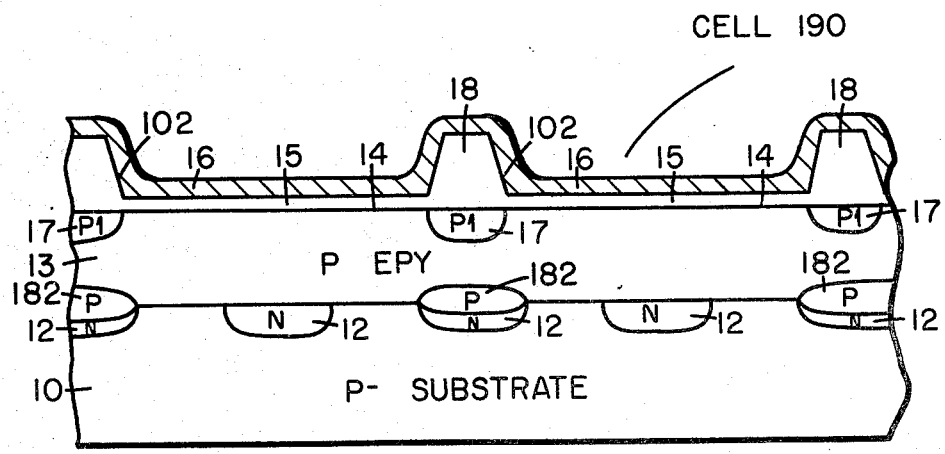
Fig_19

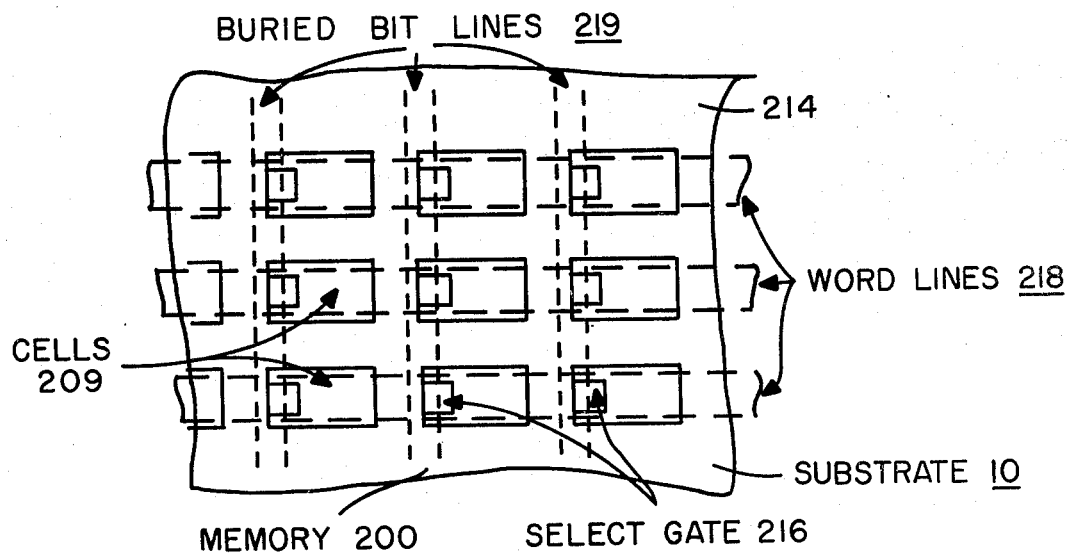
Fig_20
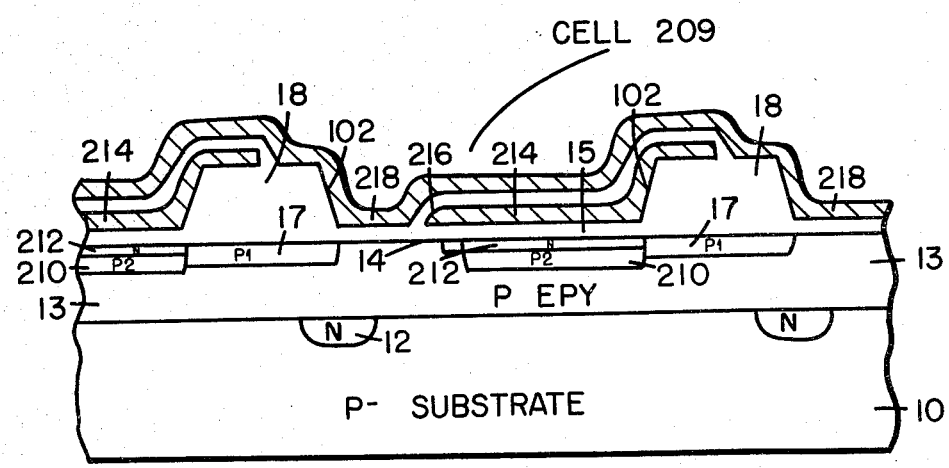
Fig_21

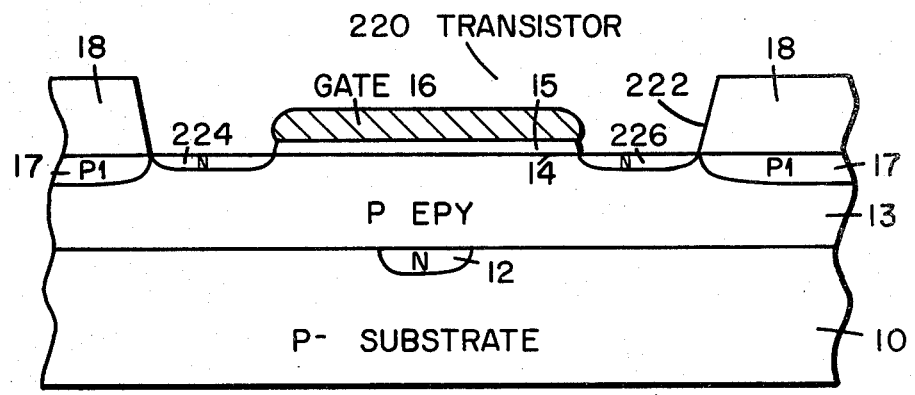
Fig_22
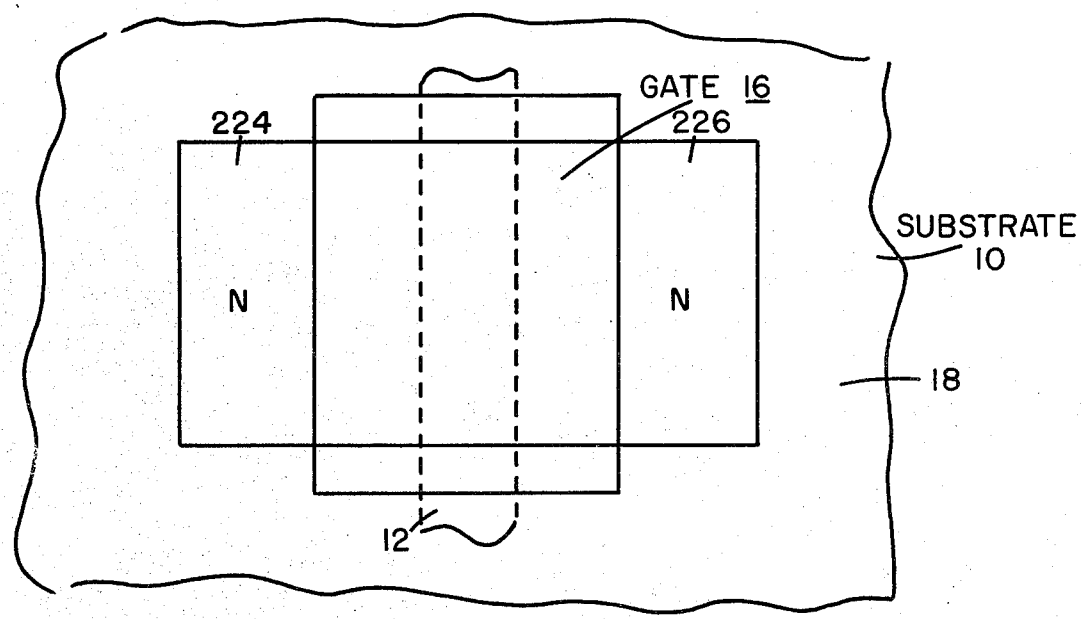
Fig_23

DYNAMIC RAM MEMORY AND VERTICAL CHARGE COUPLED DYNAMIC STORAGE CELL THEREFOR

This is a continuation of application Ser. No. 841,735, filed Oct. 13, 1977, now abandoned.

BACKGROUND OF THE INVENTION

This invention relates to a vertical cell configuration for dynamic RAM memories and to a device for coupling charges between vertically disposed potential wells.

In monolithic integrated circuits, it is often desirable to reduce the size of the individual devices in the circuits for greater economy, because the smaller the size of the circuit, the more economical is the manufacture of the circuit. In the last few years, there has been increased emphasis on new semiconductor devices which utilize vertical structures in order to increase the device density in the circuits. An example of such vertical structures are V-groove MOS transistors (VMOS) described in "VMOS Memory Technology" by T. J. Rodgers et al, ISSCC Digest of Technical Papers, February 1976, pp. 74-75, and static induction field effect transistors (SIT) described in "Static Induction Transistor Cell", Electronics, September 1977, pp. 64. However, the VMOS device requires complicated manufacturing techniques which include epitaxial layer growth and V-groove anisotropic etching and the SIT device also requires complex manufacturing techniques which include epitaxial layer growth and deep isolation diffusions which occupy relatively large chip area. These complexities increase the cost of these devices even though achieving a smaller size device.

In the dynamic random access semiconductor memory (RAM) field, the one-transistor memory cell disclosed in U.S. Pat. No. 3,387,386, which issued to R. H. Denard for "Field Effect Transistor Memory" on June 4, 1968, is widely used presently and can almost be regarded as the industry standard for 4K-bit and 16K-bit memories. This one-transistor memory cell has four physical elements, namely a storage capacitor, a select gate, a diffused bit line and an isolation element, all arranged side-by-side which results in a relatively large lateral cell area. To increase the capacity of such memories without substantially increasing the cost per bit of stored information, the size or area of the memory should remain substantially the same which requires a cell of smaller size.

There have been a number of attempts made to decrease the individual cell area by combining one or more of these four elements with varying degrees of success. In the charge coupled RAM cells described in "The Charge-Coupled RAM Cell Concept" by A. Tasch et al, IEEE Journal of Solid State Circuits, Vol. SC-11, No. 1, February 1976, pp. 58-63, one element of the storage capacitor is combined with the select gate into a single electrode to reduce the lateral extent of the cell. But this reduction is accomplished at the cost of considerable reduction of the individual cell charge storage capacity and a considerable increase in the alignment sensitivity if compared to the standard cell. In the merged charge memory cell (MCM) described in "Merged Charge Memory (MCM), A New Random Access Cell" by H. S. Lee and W. D. Pricer, Digest of Technical Papers, IEDM, December 1976, pp. 15-20, the storage capacitor is combined with the bit line, thus reducing the lateral extent of the cell. However, this cell suffers from inflexible capacitance division ratio between the bit line and the storage capacitor, from signal pattern sensitivity, and limited speed of operation.

In the SIT memory cell, the storage capacitor is combined with the bit line and the select gate is a vertical field effect transistor. This results also in inflexible capacitance division ratio between the bit line and the storage capacitor and signal pattern sensitivity. Also the use of p+ isolation diffusion as select gate results in a relatively large cell area. In the three-dimensional dual dielectric insulator memory cell described by P. C. Arnett in "Three-Dimensional Dual Insulator Memory", IBM Technical Disclosure Bulletin, Vol. 16, No. 11, April 1974, a stack of memory cells is formed, each cell including deposited word lines in one direction and deposited bit lines perpendicular thereto with a dual insulator separating the lines which is capable of storing charge at its interface. This arrangement results in most satisfactory device density but requires relatively large voltages to force current to flow through the dual insulator making the write operation rather slow.

SUMMARY OF THE PRESENT INVENTION

It is therefore a primary object of the present invention to provide an integrated circuit of the memory type in which the individual cells are small in lateral extent to provide high device or cell density.

It is a further object of the present invention to provide a dynamic RAM memory which has a high cell density and which utilizes vertical charge coupling to charge and to discharge the cell storage capacitor.

It is also an object of the present invention to utilize vertical charge coupling in a semiconductive substrate, rather than forcing a current through an insulator, to place or to remove a charge on or from a capacitive impedance.

The present invention accomplishes these objects by providing a novel integrated circuit configuration wherein a buried diffused region or channel is formed in the substrate, using standard processing techniques for monolithic integrated circuit devices. The buried region communicates by means of vertical charge coupling to an inversion layer or a diffused region at the surface of the semi-conductor. This configuration makes possible vertical charge coupling and the elements of a cell, which uses charge coupling, can be placed vertically to form a stack, thus reducing cell size. In other words, even though charge coupling is employed, the cell size is reduced.

In the cell of the present invention, the select gate and the storage capacitor are combined into a single element which is vertically aligned with a buried channel. Accordingly, the three elements combined and vertically stacked, now take no more lateral space than one of these elements in the prior art cell. The cells are arranged for common interconnection of the combined gate-capacitor element in rows to form the word lines, and the buried bit line channels in columns, to form the bit lines. The separation between the buried channel and the cell storage capacitance, as well as the vertical impurity concentration profile is selected to cause the cell capacitor to be charged and discharged by charge coupling action.

DESCRIPTION OF THE DRAWINGS

FIGS. 1A and 1B are cross-sectional views of a memory cell constructed in accordance with the present invention, illustrating a preferred embodiment thereof.

FIGS. 2A and 2B are views, in cross section form which match the cross-sectional views of FIGS. 1A and 1B, of a simplified cell which are useful to explain the vertical charge coupling concept of the cell of the present invention.

FIGS. 3 and 4 are, respectively, graphs illustrating the impurity doping profile and the potential energy distribution of the simplified cell shown in FIGS. 2A and 2B.

FIGS. 5 and 6 are, respectively, graphs illustrating the impurity doping profile and the potential energy distribution, as a function of distance from the surface on which charge is stored on the memory cell shown in FIGS. 1A and 1B.

FIG. 7 is top view of a section of a memory constructed from the cell of the present invention.

FIGS. 8A, 8B and 8C are graphs, respectively, illustrating the vertical potential distribution of the memory cell of the present invention as a function of distance from the surface on which the charge is stored during the write, read, and store operation.

FIG. 9 is an equivalent circuit diagram of the memory cell shown in FIG. 1.

FIGS. 10A and 10B are cross-sectional views, respectively, of another embodiment of the cell of the present invention.

FIGS. 11A and 11B are cross-sectional views, respectively, of another embodiment of the cell of the present invention.

FIGS. 12A and 12B are cross-sectional views, respectively, of another embodiment of the cell of the present invention.

FIGS. 13A and 13B are cross-sectional views, respectively, of another embodiment of the cell of the present invention.

FIGS. 14A and 14B are cross-sectional views, respectively, of another embodiment of the cell of the present invention.

FIGS. 15A and 15B are cross-sectional views, respectively, of another embodiment of the cell of the present invention.

FIG. 16 is a graph illustrating the potential energy distribution as a function of distance from the surface on which charge is stored in the cell shown in FIG. 1 which is useful in explaining the nondestructive read operation for the memory cells of the present invention.

FIGS. 17A and 17B are, respectively, graphs illustrating the potential energy distribution during the write and the read operation as a function of distance from the surface on which charge is stored on a cell, like the one shown in FIG. 1, when the buried channel is operated as the word line and the select gate is operated as the bit line.

FIG. 18 is a top view of a section of a memory constructed from still another embodiment of the cell of the present invention in which the cells are arranged to form a folded matrix.

FIG. 19 is a cross-sectional view of an embodiment of the cell of the present invention which is useful for folded matrix operation and which may be utilized for the memory shown in FIG. 18.

FIG. 20 is a top view of a section of a memory formed from still another embodiment of the cell of the present invention.

FIG. 21 is a cross-sectional view of an embodiment of the cell of the present invention utilizing separate elements to respectively form the capacitor and the word line, and is the device from which the memory shown in FIG. 20 is formed.

FIG. 22 is a cross-sectional view of a transistor utilizing the vertical charge-coupling; and FIG. 23 is a top view of the transistor shown in FIG. 22.

DETAILED DESCRIPTION OF THE INVENTION

Referring now to FIGS. 1A and 1B of the drawings, which respectively illustrate two cross-sectional views taken through a preferred embodiment of the cell of this invention, there is shown a substrate 10 of semiconductive material which has p-type impurity concentration (hereinafter referred to as p-type). Substrate 10 has diffused or implanted into its upper surface, with the aid of a mask, a channel region 12 which has an n-type impurity concentration (hereinafter referred to as n-type). A p-type epitaxial layer 13, having an upper surface 14, is grown on the upper surface of substrate 10 and over channel region 12, making channel 12 a buried channel region. Thereafter, with the assistance of another mask, a p-type channel 17 is diffused or implanted into the top surface of epitaxial layer 13 to act as a conventional channel stop and to circumscribe the boundaries of the cell in a conventional manner. Then, a thick silicon oxide layer 18 is thermally grown over surface 14 to cover the region of surface 14 circumscribed by channel stop 17 which is herein referred to by reference character 99 and which marks the lateral extent of the operative portion of the cell. Oxide layer 18 also extends over at least the adjacent portion of channel stop 17. Using another mask, the portion 102 of oxide layer 18 overlying region 99 is entirely etched away to expose surface region 99 of epitaxial layer 13. The next step is to thermally grow a thin layer 15 of silicon oxide over region 99 and, finally, a metallizing strip 16 is deposited over silicon oxide layers 15 and 18.

As will be explained hereinafter, if the cell of FIG. 1 is combined with a plurality of other cells in rows and columns, to form a memory, as shown in FIG. 7, metallizing strip 16 interconnects the cells forming a column to become the word lines, and buried channel 12 interconnects the cells forming a row to become the bit line. As will become better understood hereinafter, the charge stored or not stored, which respectively represents either a "zero" or a "one", will be stored or not stored in the portion of surface 14 which is coextensive with the active portion of the cell, namely 99, formed between silicon oxide layer 15 and upper surface 14 of epitaxial layer 13 and circumscribed by channel stop 17 also referred to as 14A. The charge is deposited and removed from the interface 14A by charge coupling, as contrasted with forcing currents through insulators and, accordingly, conditions for charge coupling in the cell of this invention must be met.

For the purpose of explaining the vertical charge coupling operation of the cell illustrated in FIG. 1, there is illustrated a somewhat more simplified version of that cell in FIGS. 2A and 2B, in which like reference characters designate like part. Basically, the simplified cell of FIG. 2 includes a substrate 10 of a p-type semiconductive material which has embedded in it an n-type channel region 12. The upper surface of substrate 10 is covered by a p-type epitaxial layer 13 into which is implanted or diffused a conventional channel stop 17 which circumscribes the lateral extent of the cell and defines the active cell area 99. On the upper surface 14 of epitaxial layer 13 is grown a thick oxide layer 18 which is then etched away at 102, i.e., inside channel stop 17, to expose the active portion of surface 14. The exposed region of surface 14 has implanted or diffused into it a dopant to form an n-type region 20. As will become better understood hereinafter, region 20 in FIG. 2 is, for the purpose of explaining the charge coupling operation, the equivalent of surface portion 14A of FIG. 1.

FIGS. 3 and 4, respectively, are graphs illustrating the impurity concentration profile and the energy band diagram of the device shown in FIG. 2. More particularly, FIG. 3 shows a graph 50, which represents variation in dopant concentration versus the distance from the surface 14 of epitaxial layer 13, with the point on the abscissa marked A corresponding to the lower boundary of channel 20, the point on the abscissa marked B corresponding to the lower surface of epitaxial layer 13, and the point on the abscissa marked C corresponding to the lower boundary of diffused channel region 12. Accordingly, the portion on the abscissa marked O-A represents region 20, the portion marked O-B represents epitaxial layer 13, and the portion marked B-C represents channel 12.

FIG. 4 shows a graph 51, which represents variations in electron potential energy with distance from the upper surface 14 along the abscissa using the same scale as for the abscissa of FIG. 3, if positive potentials are applied to regions 20 and 12 with respect to substrate 10 and the potential applied to region 20 is higher than to region 12, and represents the energy required to vertically move a charge from surface 14 towards substrate 10. As is readily seen, little if any energy is required to move a charge from O to A, and from B to C, and these two regions are known as potential wells. But the energy required to move a charge from A to B is considerable and shows the existence of a potential barrier between the two potential wells which extends from A to B. In order to directly move charges from one potential well to the other, which is the process generally referred to as charge coupling, it is necessary to apply a potential difference between the wells which is capable of moving the charge across the potential barrier. For a given impurity concentration profile, such as shown by graph 50 in FIG. 3, the potential barrier is a function of potentials applied to regions 20 and 12. The height of the potential barrier is also a function of the thickness of the layer between region 20 and channel 12, and of course, of the impurity concentration profile between these two points.

In order to insure a charge coupling between the two potential wells, certain conditions have to be met, else the application of potentials may cause charge injection which is undesirable for the purpose of this invention. To allow vertical charge coupling, it is necessary that the doping profile between the upper and lower potential wells of FIG. 4, and the physical separation between them be selected so that, under the application of appropriate voltages, the charges can move vertically instead of in all directions which would lead to undesirable charge injection. For example, for the charges to couple vertically between the potential wells with a few volts differential (say 5 volts), the well separation should be in the range of about 5-1 $\mu$m and the doping of the separation layer, i.e., the epitaxial layer, should be in the range of about $5 \times 10^{14}$ dopant atoms/cm$^3$ to $1 \times 10^{16}$ dopant atoms/cm$^3$, respectively. It is also to be noted from FIG. 4 that the potential wells and the barrier between the wells are completely isolated from epitaxial layer 13 and substrate 10. The doping of the buried channel 12 is not critical, but should be great enough to prevent depletion of carriers when charges are moved from the interface 14 wherey they are stored to channel 12. A concentration about $1 \times 10^{16}$ dopant atoms/cm$^3$ ordinarily satisfies this condition. Another way of insuring that the carriers are not depleted when charges are moved in channel 12 is to make the channel deeper.

FIGS. 5 and 6 illustrate, respectively, the impurity concentration profile and the energy band diagram of the cell depicted in FIG. 1 as a function of distance from charge deposited at the surface 14A and to the same scale as in FIG. 3. More particularly, graph 52 of FIG. 5 shows the impurity concentration starting at surface 14A of epitaxial layer 13 which differs up to point B from the profile shown in FIG. 3 because of the absence of diffused region 20. The abscissa again represents the distance from surface 14 and points B and C marked on the abscissa represents the same points as the ones explained in connection with the description of FIG. 3. Graph 53 of FIG. 6 shows the variation of electron potential energy as a function of distance from surface 14 and the curve follows fairly closely to the curve shown in FIG. 4 except that the flat portion between O and A does not exist because of the absence of channel 20. However, it is clearly seen from FIG. 6 that the cell of FIG. 1 has two potential wells with a barrier inbetween which has to be overcome if charge coupling is to take place.

In FIGS. 3 and 5, on curves 50 and 52, the impurity concentration is designated by the letter N followed by a subscript which designates the regions having such concentration. For example, $N_{12}$ represents the impurity concentration of channel region 12.

Similarly as before, by selecting the potentials applied to region 12 and conductive strip 16, which is also the gate electrode of the cell of FIG. 1, and assuming that the thickness of separation layer 13 and the entire vertical doping profile has been selected for charge coupling conditions, vertical charge coupling occurs between the potential well at surface 14A of epitaxial layer 13 and buried channel 12. It should be noted that the vertical charge coupling between interface 14A and region 12 is totally isolated from the substrate so that the entire integrity of the charge packet is moved vertically without any charge loss due to recombination with majority hole carriers in the epitaxial layer 13.

Referring now to FIG. 7 of the drawing, there is illustrated an arrangement of connecting a plurality of cells, such as the one shown in FIG. 1, to construct a memory 68. Generally speaking, cells 69 are arranged in rows and columns in a standard matrix pattern, and interconnecting between cells are made by connecting conductive strips 16 of all cells in a row to form a word line 70, and by connecting buried channel 12 of all cells in a column to form a bit line 72. At the point of intersection of a bit and a word line, there is a random access charge-coupled cell 69 constructed in accordance with the present invention. It is, of course, to be understood that the actual manufacture of memory 68 follows integrated circuit manufacturing techniques and that the fabrication involves all the steps indicated in the description of the cell of FIG. 1, except that the buried channel region 12 extends along the entire length of a column to form bit line 72 and conductive strip 16 extends along the entire length of a row to form word line 70.

FIGS. 8A, 8B and 8C illustrate the operation of the dynamic cell of FIG. 1, and of memory 68 of FIG. 7, in the read, write and store modes, respectively, and FIG. 9 represents an equivalent circuit diagram of the dynamic memory cell of FIG. 1 which is useful in explaining the operation in these various modes because it reduces the vertical charge coupling of the cell into two independent paths for the read and write operation. $S_W$ and $S_{Rd}$ present, respectively, the required voltage differential between interface 14A and buried channel 12 for the charge to couple vertically between the two potential wells for the write and read operations. $C_{ox}$ represents the gate oxide capacitance 15, $C_{SBB}$ represents the interface 14A to substrate 10 capacitance, $C_{SBL}$ represents the potential well at interface 14A to the buried channel 12 capacitance, and $C_{BLBB}$ represents buried channel 12 to the substrate 10 capacitance.

In FIG. 8A, during the write operation, the gate electrode voltage applied to word line 70 is at $V_{G/W}$ (say about 10 volts), and the bit line 72 (buried channel 12) is maintained either at $V_{BL/W0}$ (say about 0 volts) to inject a ZERO charge into the potential well at the interface 14 or has applied to it $V_{BL/W1}$ (say about 5 volts) to inject a ONE charge into the potential well. In FIG. 8C, during the store operation, the gate electrode voltage applied to word line 70 is reduced to $V_{G/St}$ (say about 5 volts), where $V_{G/St} < V_{G/W}$. Thus the signal charge at the interface 14A is stored irrespective of whether the potential of bit line 72 is at $V_{BL/W1}$ (say about 5 volts) or at $V_{BL/W0}$ (say about 0 volts). In FIG. 8B, during the read operation, the potential of bit line 72 is increased to $V_{BL/Rd}$ (say 5 volts), and the gate electrode potential applied to word line 70 is reduced to $V_{G/Rd}$ (say 0 volts), where $V_{G/Rd} < V_{G/St}$, thus dumping any stored ZERO charge at the interface 14A to bit line 72 to be sensed at the far end of the memory-array. The equivalent signal charge voltage $V_{sig}$ stored in the potential well at the interface 14 is about 5 volts in this case.

The required values of $S_W$ and $S_{Rd}$ for charge coupling are related to the doping profile as described above to a first order approximation for a uniform doping profile by the following relationship (assuming $N_{12} > N_{13}$ in FIG. 5.)

$$S_{Rd} = S_W = \frac{eN_{13}}{2\xi_s}\left[\Delta x - \frac{2\xi_s V_{BI}}{eN_{13}}\right] - V_{BI}$$

where e is the electron charge, $\xi_s$ it the substrate permitivity and $V_{BI}$ the built-in voltage $$\left[\alpha\left(\frac{KT}{e}\ln\frac{N_{13}}{n_i} + 0.55\right)\right]$$

for silicon substrate where $n_i$ is the intrinsic concentration, (KT/o) the thermal voltage, and $\Lambda X$ is the extent of the separating layer between the vertically disposed potential wells.

The memory cell described in FIG. 1 above provides flexibility in design and layout. The storage capacitance of the cell can be increased by decreasing the thickness of the oxide 15 or increasing the word line and bit line voltage swing, or increasing the cell area in the row direction without increasing the capacitance of buried channel region 12. Increasing the cell area in the row direction helps accommodate the pitch of the sense amplifier at the end of the memory array. Also, keeping the vertical cell height at a minimum reduces the capacitance of buried channel region 12 and therefore the bit line. The buried channel 12 capacitance comprises a component to substrate 10 ($C_{BLBB}$ in FIG. 9) and another component to the inversion layer at the interface 14A ($C_{SBL}$ in FIG. 9). In order to maximize the signal voltage swing to be detected by the sense amplifier at the end of the memory array, the total bit line 72 capacitance should be minimized. The first capacitance component to the substrate can be reduced be decreasing the doping concentration of substrate 10 and of epitaxial layer 13. The second capacitance component can be reduced by decreasing the width of buried channel 12 and/or increasing the physical separation between channel 12 and the potential well at interface 14A. The time constant of collecting the charge dumped on buried channel 12 from the potential well at interface 14A during the read operation illustrated in FIG. 8B for the sense amplifier at the end of the memory array can be minimized by decreasing buried bit line 72 capacitance as described above, and reducing its sheet resistance by increasing the concentration of the n-dopants in buried channel 12.

There are a number of other embodiments of the cell of FIG. 1 which will now be described, and like parts and/or functionally equivalent parts will be designated by like reference characters.

The cell 101 shown in FIGS. 10A and 10B comprises a substrate 10 of p-type semiconductive material which has diffused or implanted into it an n-type channel 12, and a p-type epitaxial layer 13 grown on the substrate surface to make channel 12 a buried channel. Thereafter, a mask is used to diffuse or implant a p-type region 100 into the upper surface 14 of layer 13 which functions, in combination with a thick oxide, as a channel stop as is well-known to those skilled in the art. Then a thick silicon oxide layer 18 is grown on surface 14 of layer 13, and a portion 102 of oxide layer 18 which includes the area overlying channel 12 is etched away to circumscribe the active cell area. Then an optional n-type dopant is implanted or diffused through the oxide opening 102 to form an n-type region 104, and a thin oxide layer 15 is thermally grown to cover opening 102 and region 104. Thereafter, a metallizing strip 16 is deposited over layers 15 and 18 to form the word line and one plate of the cell storage capacitor, the other plate being now formed by n-type region 104. One advantage of the embodiment shown in FIG. 10 over that of FIG. 1 is that the utilization of this type of channel stop such as 100 and the utilization of a region such as 104 under the cell storage capacitor simplifies the cell fabrication and thereby reduces cost.

The embodiment of the memory cell 111 shown in FIG. 11 is similar to the embodiment shown in FIG. 10, except that a p-type region 110 is implanted or diffused through the oxide opening 102 before growing the thin oxide 15. In case optional n-type region 104 is desired, it would be implanted or diffused through the oxide opening 102 into region 110 to a depth less than the depth of region 110. The advantage of utilizing a region such as 110 in FIG. 11 is that potential $S_{Rd}$ can be made greater than potential $S_W$ as set forth in connection with the description of FIG. 9, which may be desirable for certain applications.

The embodiment of the cell 121 disclosed in FIG. 12 is similar to the one shown in FIG. 1, except that it includes a p-type region 120 which is diffused or implanted into channel region 12, through the same mask, prior to growing the epitaxial layer 13. The remainder of the fabrication sequence for cell 121 is similar to the one described in connection with the cell of FIG. 1, except for an optional n-type region 104 in surface 14 of layer 13 which is obtained by implanting or diffusing n dopants through oxide opening 102 to shift the second plate of the storage capacitor of cell 121 from surface 14 to region 104. The advantage which results from providing region 120 is that potential $S_{Rd}$ can be made smaller than potential $S_W$, as these terms are defined in connection with the description of FIG. 9, which results in some advantages for certain applications.

Referring now to the three embodiments of the cell of the invention shown in FIGS. 13, 14 and 15, these differ from the cells previously described primarily in that they are constructed by successive diffusions or implantations instead of utilization of an epitaxial layer.

Referring now specifically to cell 137 shown in FIG. 13, a p-type substrate 10 having a surface 130 which has diffused or implanted into it an n-type channel region 131 through a first mask. Thereafter, and still using the same mask, a p-type diffusion or implantation is conducted to a depth less than the first diffusion or implantation to form a channel region 132. Thereafter, a p-type region 134 is diffused or implanted over the entire cell surface into substrate 10 to form a conventional channel stop, together with a thick oxide, which circumscribes the active area of the cell. Thereafter, a heavy oxide layer 18 is grown to cover the entire cell surface of substrate 10, and a portion 102, which circumscribes the active portion of cell 137, is etched away to expose, once more, surface 130 of substrate 10. Thereafter, an n-type region 136 is diffused or implanted into the portion of surface 130 which is exposed through opening 102 to a depth which is less than the depth of region 132. Opening 102 is then covered with a thin oxide layer 15, and thin oxide layer 15 as well as a portion of thick oxide layer 18 are then covered with a metal layer 16 which will define the word line after the cell is assembled in the form of a matrix.

The cell 140 shown in FIG. 14 differs from cell 137 primarily in that region 132 is not formed through the same mask as channel 131, but rather through opening 102, and is therefore considerably wider in extent. For the sake of simplicity, the region in FIG. 14 corresponding to channel 132 of FIG. 13 is identified with reference character 132A, the remaining regions and elements having been given the same reference characters.

The cell 150 shown in FIG. 15 includes both the p-type region 132 of FIG. 13 formed through the same mask which forms channel 131, and also the p-type region 132A of FIG. 15 which is formed through opening 102. Again, the same reference characters are used as those employed in connection with the description of FIGS. 13 and 14.

For the cell embodiments illustrated in FIGS. 13, 14 and 15, the cell capacity is provided by conductive layer 16, region 136 and the separating thin oxide layer 15. In order to provide conditions for charge coupling, it should be recognized that the charges have to travel from the lower surface of region 136 to the lower surface of region 132, or 132A, as the case may be, and this distance, as well as the impurity concentration profile of regions 131, 132 or 132A and 136 must be selected in accordance with the guidelines provided hereinabove for charge coupling between the lower plate of the cell storage capacitor and channel region 131 (the bit line). The primary advantage realizable from utilization of the cell embodiments of FIGS. 13–15 is simplicity in construction, and therefore a savings in cost, because it is unnecessary to grow an epitaxial layer on the surface of the substrate.

The dynamic memory cells of the present invention, and the memories constructed therefrom, can also be designed in such a manner that the readout becomes nondestructive. To accomplish this, one condition that has to be satisfied is that during the read operation, the carriers in channel 12 can be depleted which requires the presence of less carriers than stated hereinbefore for destructive readout. The number of carriers in channel 12 (or channel 131) can be reduced either by lowering the impurity concentration, say to somewhere between $10^{14}$ and $10^{16}$ dopant atoms/cm$^3$, or by decreasing its depth, or both.

FIG. 16 illustrates the operation of a nondestructive readout, and shows curves 160 and 161 which are, respectively, plots of electron potential energy against distance from surface 14 as described before in connection with FIGS. 4, 6 and 8. Curve 160 illustrates nondestructive readout for a ZERO condition, and curve 161 illustrates nondestructive readout for a ONE condition. In destructive readout, as discussed in connection with the description of FIG. 8, the gate potential $V_{G/Rd}$ was reduced to zero volts. For nondestructive readout, and in the case that carriers can be completely depleted, the gate potential is raised to approximately 10 volts. In the case there is no stored electron charge at interface 14, representing a ONE, the depletion region extends inside buried channel 12 which becomes pinched-off and its resistance becomes very high. In the case there is a stored electron charge at the interface 14 representing a ZERO, the depletion region extends partly into buried channel 12 which then possesses a finite resistance. The difference between the very high resistance of the pinched-off buried channel when reading a ONE and the finite resistance when reading a ZERO can be sensed by monitoring the current flow in buried channel 12 with a voltage difference across its ends, without destroying the stored charge in the cell.

Another way to operate a memory constructed of the cells of the present invention is to interchange the word and bit lines. Such an exchange of word and bit lines does not change the cell configuration, or the conditions of charge coupling, but does change the operation of the memory. The read and write operations for such operation of the memory are illustrated, respectively, in FIGS. 17A and 17B. The write operation is achieved by increasing the buried channel 12 potential to $V_{BL/W}$, say 5 volts, and by reducing the gate potential to $V_{G/W1}$, say 0 volts, to write a ONE and to $V_{G/W0}$, say 5 volts, to write a ZERO. This is shown graphically by curve 170 for writing a ONE and by curve 171 for writing a ZERO, which represent electron potential energy against distance from surface 14. The read operation is achieved by increasing the gate voltage to $V_{G/Rd}$, say 10 volts, and then let it float. The potential of buried channel 12 is then reduced to $V_{BL/Rd}$, say 0 volts. For a ONE stored at the interface, charge will be vertically coupled from buried channel 12 to interface 14 changing the image charge on gate 16 (now the bit line) and reducing its floating potential which is illustrated by curve 172. For a ZERO stored at the interface, no charge will be coupled from buried channel 12 to interface 14 which is illustrated by curve 173. The read operation described above and illustrated in FIG. 17B is destructive.

An alternative arrangement for a memory, using the cells of this invention, is illustrated in FIG. 18 and is often referred to as a folded matrix arrangement. Memory 180 comprises a substrate 10, having bit lines 181 in the form of buried channels, and word lines 183 in the form of conductive strips at right angles to bit lines 181. Contrasted with the matrix arrangement of FIG. 7, the buried bit lines 181 are folded which means that the cell storage capacitor of each individual cell in a row, which are connected to a word line 183, couple vertically only to every other bit line 181. Such an arrangement requires the use of buried channel seals 182 to prevent any vertical charge coupling to unwanted buried bit lines 181 and therefore requires a special cell configuration.

A suitable cell 190 configuration for a folded matrix is illustrated in FIG. 19 which shows a substrate 10 of p-type semiconductive material, which has diffused or implanted into its upper surface a buried n-type channel 12. Thereafter, p dopants are diffused or implanted through another mask into every other channel region 12 to form p-type channel regions 182 which act as buried channel seals. The thickness and the doping of seal regions 182 are selected to prevent vertical charge coupling between interface 14 and the unwanted bit lines 181. For example, a thickness of 2 to 1 $\mu$m and a doping of $1 \times 10^{16}$ dopant atoms/cm$^3$ to $5 \times 10^{17}$ dopant atoms/cm$^3$, respectively, can be used. A p-type epitaxial layer 13 is then grown, and the remaining steps in the fabrication are the same described in connection with the cell illustrated in FIG. 1.

FIGS. 20 and 21 illustrate, respectively, another embodiment of a memory 200 constructed in accordance with the present invention and a suitable cell 209 therefor. Referring initially to cell 209 illustrated in FIG. 21, there is shown a p-type substrate 10 having diffused or implanted into its surface an n-type channel 12 and thereafter having grown on the upper surface an epitaxial layer 13 having an upper surface 14, which makes region 12 a buried channel. Thereafter, a p-type channel stop 17 is diffused or implanted into surface 14 and a thick oxide layer 18 is grown on surface 14. Then a portion 102, which circumscribes the active cell area, is etched away, and a p-type region 210 is selectively diffused or implanted into exposed surface 14. Thereafter, an n-type region 212 is selectively diffused or implanted into region 210 and a thin oxide 15 is thermally grown over the exposed portion of surface 14. A metallizing layer 214 is then deposited on oxide layer 15 to define one plate of the cell storage capacitor. An opening 216, approximately square in extent, is etched into layer 214 near the edge of oxide opening 102 for a purpose hereinafter explained. Thereafter, a second metallizing layer 218 is deposited over the entire surface of the cell to form the select gate or word line 218. The reason for opening 216 is to allow coupling of word line 218 to buried channel 12 which forms the bit line 219. The purpose to be served by this embodiment of memory 200 and cell 209 therefor is to allow the word line voltage to swing between two levels $V_{G/St}$ and $V_{G/RdW}$, say between 0 volts and 5 volts, respectively, compared to the three levels of voltage swing required in the dynamic cell memory embodiment illustrated in FIG. 1. In other words, this embodiment allows the utilization of only two voltages to read, write and store in the memory instead of three voltages that are required with the memory illustrated in FIG. 7.

Certain conditions will have to be met for vertical charge coupling in cell 209. The doping and the thickness of epitaxial layer 13 separating the inversion layer 14 under the select gate 218 and buried bit lines 219 is selected to provide vertical charge coupling with the voltage parameters $S_{Rd}$ and $S_W$ in FIG. 9 reduced to about one volt or less. This is achieved by adjusting the doping to about $1 \times 10^{14}$ dopant atoms/cm$^3$ to about $1 \times 10^{15}$ dopant atoms/cm$^3$ and the thickness to between 1 and 4 $\mu$m. No charge coupling occurs between buried bit lines 219 and the bottom plate of the storage capacitors 212 except through the inversion layer under the select gate 218. When the select gate potential is high at $V_{G/RdW}$, the charge under the cell storage capacitor couples to bit lines 219 for the read and write operation. When the select gate potential is low at $V_{G/St}$, the signal charge is stored under the cell storage capacitor and isolated from buried bit lines 219. The select gate 218 in FIGS. 21 and 22 can in general be any gate under which an inversion layer is formed to vertically charge couple to buried bit lines 219 and to the cell storage capacitor. For example, the select gate 218 can be formed on a V-groove as long as the inversion layer under it couples vertically to the buried channel 12. Cell 209 can be arranged into a folded matrix and the select opening 216 does not have to be placed at the edge of the cell but may be placed in the middle or in any desirable position of the active cell area.

In all the embodiments of the vertical charge-coupled memory cell described above, the surface channel isolation provided by the p-channel stop regions and the thick oxide regions 18 can be obtained with any other conventional means of channel isolation such as the self-aligned channel stop and thick field oxide process. Vertical charge coupling, as heretofore described, can also be utilized to operate an MOS transistor and FIGS. 22 and 23 show, respectively, a cross section and a plan view of such a vertically charge-coupled MOS transistor 220. Transistor 220 is similar in construction to the vertical charge-coupled memory cell in FIG. 1 with the exception of n-type regions 224 and 226 and the same reference characters have been used wherever possible. A p-type substrate 10 has diffused or implanted into its upper surface a buried n-type channel 12 and a p-type epitaxial layer 13 is grown on that surface. Thereafter, a mask is used to diffuse or implant p-type channel stop 17 and a thick oxide 18 on the surface 14 of layer 13. Then a portion 222 of oxide 18 is removed, a thin gate oxide 15 is selectively grown and a metallizing strip 16 is deposited thereon. Also n-type regions 224 and 226 are diffused or implanted into surface 14 between gate 16 and thick oxide 18. The doping and the thickness of epitaxial layer 13 between buried channel 12 and the inversion layer on surface 14 must be selected as set forth hereinbefore for vertical charge coupling. The voltages applied to gate 16 and channel 12 control the flow of electric current between the n-type regions 224 and 226 and buried channel 12.

What is claimed is:
1. A dynamic storage cell within an array of such cells and operative in read and write modes comprising:
    a substrate formed of semiconductive material having a first conductivity type;

a buried channel of a second conductivity type formed in said substrate which terminates in the upper surface of said substrate;

a continuous first layer of substantially uniform thickness of semiconductive material of said first conductivity type disposed on said substrate and said buried channel;

an insulating layer overlying the upper surface of said first layer;

a third conductive layer deposited over said insulating layer, said conductive layer forming one plate of a storage capacitor which overlies said buried channel and the interface between said first layer and said insulating layer forming the other plate of said storage capacitor, the thickness and dielectric constant of said insulating layer being selected to provide a predetermined capacitive impedance of said storage capacitor;

sources of voltages connected to said buried channel, said conductive layer and said substrate having magnitudes sufficient to establish a continuous depletion region between the buried channel and the interface and maintain the potential energy of charge carriers in the first layer between the buried channel and the interface less than the potential energy of charge carriers in the substrate and in the first layer outside said buried channel and said interface; and at least the thickness and doping profile of said first layer being selected to provide isolated vertical charge coupling of substantially all charge between said buried channel and the interface between said first and insulating layers during the read and write modes in response to said voltages, whereby the isolated vertical charge coupling prevents any significant coupled charge from recombining with charges in the substrate and in said first layer or being collected by neighboring cells of the array, in which a first region of said first conductivity type and of higher impurity concentration than said first layer is formed in the first layer which terminates in the upper surface of said first layer; said first region acting as a channel stop region to define and circumscribe the active cell and a second region of said first conductivity type and having an impurity concentration different from that of said first region formed in said active cell which terminates in said upper first layer surface; and a third region of said second type conductivity formed in said region which terminates in said upper first layer surface.

2. A dynamic storage cell within an array of such cells and operative in read and write modes comprising:

a substrate formed of semiconductive material having a first conductivity type;

a buried channel of a second conductivity type formed in said substrate and terminating in the upper surface of said substrate;

a continuous first region of substantially uniform thickness of said first conductivity type and of higher impurity concentration than said substrate formed in said substrate and said buried channel which terminates in the upper surface of said substrate, the depth of said first region being less than the depth of said buried channel, a second region of said second conductivity type formed in said first region which terminates in the upper surface of said substrate, said second region overlying said buried channel and defining and circumscribing an active area of said cell, the depth of said second region being less than the depth of said first region;

in which a further channel, of substantially the same extent as said buried channel but of said first conductivity type and of higher impurity concentration than said substrate and of lower impurity concentration than said second region, is formed in said buried channel, the depth of said further channel being less than the depth of said buried channel;

an insulating layer overlying the upper surface of said substrate;

a conductive layer deposited over said insulating layer, said conductive layer forming one plate of a storage capacitor which overlies said buried channel and said second region forming the other plate of said storage capacitor, the thickness and dielectric constant of said insulating layer being selected to provide a predetermined capacitive impedance of said storage capacitor;

sources of voltages connected to said buried channel, said conductive layer and said substrate and having magnitudes sufficient to establish a continuous depletion region between the buried channel and the second region and maintain the charge carrier potential energy in said first region between said buried channel and said second region less than the charge carrier potential energy in said substrate and in said first region outside said buried channel and said second region; and the thickness and impurity concentration profile of said buried layer, and at least said first region being selected to provide isolated vertical change coupling of substantially all charge between said buried channel and said second region during the read and write modes whereby the isolated vertical charge coupling prevents any significant coupled charge from recombining with charges in the substrate and said first region or being collected by neighboring cells of the array.

3. A dynamic storage cell within an array of such cells and operative in read and write modes comprising:

a substrate formed of semiconductive material having a first conductivity type;

a buried channel of a second conductivity type formed in said substrate and terminating in the upper surface of said substrate;

a continuous first region of substantially uniform thickness of said first conductivity type and of higher impurity concentration than said substrate formed in said substrate and said buried channel which terminates in the upper surface of said substrate, the depth of said first region being less than the depth of said buried channel, a second region of said second conductivity type formed in said first region which terminates in the upper surface of said substrate, said second region overlying said buried channel and defining and circumscribing an active area of said cell, the depth of said second region being less than the depth of said first region;

in which a third region of said first conductivity type and of higher impurity concentration than said first region is formed in said first region, said third region having a lateral extent which is substantially the same as the lateral extent of said second region, the depth of said third region being less than the depth of said buried channel, an insulating layer overlying the upper surface of said substrate;

a conductive layer deposited over said insulating layer, said conductive layer forming one plate of a storage capacitor which overlies said buried channel and said second region forming the other plate of said storage capacitor, the thickness and dielectric constant of said insulating layer being selected to provide a predetermined capacitive impedance of said storage capacitor;

sources of voltages connected to said buried channel, said conductive layer and said substrate and having magnitudes sufficient to establish a continuous depletion region between the buried channel and the second region and maintain the charge carrier potential energy in said first region between said buried channel and said second region less than the charge carrier potential energy in said substrate and in said first region outside said buried channel and said second region; and the thickness and impurity concentration profile of said buried layer, and at least said first region being selected to provide isolated vertical change coupling of substantially all charge between said buried channel and said second region during the read and write modes whereby the isolated vertical charge coupling prevents any significant coupled charge from recombining with charges in the substrate and said first region or being collected by neighboring cells of the array.

4. A dynamic storage cell within an array of such cells and operative in read and write modes comprising:
a substrate formed of semiconductive material having a first conductivity type;
a buried channel of a second conductivity type formed in said substrate and terminating in the upper surface of said substrate;
a continuous first region of substantially uniform thickness of said first conductivity type and of higher impurity concentration than said substrate formed in said substrate and said buried channel which terminates in the upper surface of said substrate, the depth of said first region being less than the depth of said buried channel, a second region of said second conductivity type formed in said first region which terminates in the upper surface of said substrate, said second region overlying said buried channel and defining and circumscribing an active area of said cell, the depth of said second region being less than the depth of said first region;
in which a further channel, of substantially the same extent as said buried channel but of said first conductivity type and of higher impurity concentration than said substrate and of lower impurity concentration than said second region is formed in said buried channel, the depth of said further channel being less than the depth of saie buried channel; and
a third region of said first conductivity type and of higher impurity concentration than said first region is formed in said first region, said third region having a lateral extent which is substantially the same as the lateral extent of said second region, the depth of said third retion being less than the depth of said buried channel,
an insulating layer overlying the upper surface of said substrate;

a conductive layer deposited over said insulating layer, said conductive layer forming one plate of a storage capacitor which overlies said buried channel and said second region forming the other plate of said storage capacitor, the thickness and dielectric constant of said insulating layer being selected to provide a predetermined capacitive impedance of said storage capacitor;

sources of voltages connected to said buried channel, said conductive layer and said substrate and having magnitudes sufficient to establish a continuous depletion region between the buried channel and the second region and maintain the charge carrier potential energy in said first region between said buried channel and said second region less than the charge carrier potential energy in said substrate and in said first region outside said buried channel and said second region; and the thickness and impurity concentration profile of said buried layer, and at least said first region being selected to provide isolated vertical change coupling of substantially all charge between said buried channel and said second region during the read and write modes whereby the isolated vertical charge coupling prevents any significant coupled charge from recombining with charges in the substrate and said first region or being collected by neighboring cells of the array.

5. A dynamic storage cell within an array of such cells and operative in read and write modes comprising:
a substrate formed of semiconductive material having a first conductivity type;
a buried channel of second conductivity type formed in said substrate which terminates in the upper surface of said substrate;
a continuous first layer of substantially uniform thickness of semiconductive material of said first conductivity type disposed on said substrate and said buried channel;
an insulating layer overlying the upper surface of said first layer;
a third conductive layer deposited over said insulating layer, said conductive layer forming one plate of a storage capacitor which overlies said buried channel and the interface between said first layer and said insulating layer forming the other plate of said storage capacitor, the thickness and dielectric constant of said insulating layer being selected to provide a predetermined capacitive impedance of said storage capacitor;
sources of voltage connected to said buried channel, said conductive layer and said substrate having magnitudes sufficient to establish a continuous depletion region between the buried channel and the interface and maintain the potential energy of charge carriers in the first layer between the buried channel and the interface less than the potential energy of charge carriers in the substrate and in the first layer outside buried channel and said interface; and
at least the thickness and doping profile of said first layer being selected to provide isolated vertical charge coupling of substantially all charge between said first layer and insulating layers during the read and write modes in response to said voltages, whereby the isolated vertical charge coupling prevents any significant coupled charge from recombining with charges in the substrate and in said first layer or being collected by neighboring cells of the array, in which a tub-shaped channel stop region of said first conductivity type and of higher impurity concentration than said first layer is formed in said first layer to define and circumscribe an active cell area, and said channel stop region terminating in the upper surface of said first layer, in which another channel of said second conductivity type is formed in said substrate to underly said channel stop region, and a further channel of said first conductivity type of a higher impurity concentration than said first layer, said further channel forming a buried seal for isolating said another channel from participation in the vertical charge coupling.

6. In a dynamic storage cell within an array of such cells and operative in read and write modes, the cell comprising:

a substrate formed of semiconductor material having a first conductivity type;

a buried channel of a second conductivity type formed in said substrate which terminates in the upper surface of said substrate;

a continuous first layer of substantially uniform thickness of semiconductive material of said first conductivity type disposed on said substrate and said buried channel;

an insulating layer overlying the upper surface of said first layer; and a third conductive layer deposited over said insulating layer, said conductive layer forming one plate of a storage capacitor which overlies said buried channel and an interface between said first layer and said insulating layer forming the other plate of said storage capacitor, the thickness and dielectric constant of said insulating layer being selected to provide a predetermined capacitive impedance of said storage capacitor;

a method of operating said storage cell, comprising the steps of applying potentials to said buried channel, said substrate and said conductive layer, said potentials being at levels selected in accordance with the thickness and doping profile of said first layer to cause isolated vertical charge coupling of substantially all charge in both the read and write modes between buried channel and the interface between said first layer and said insulating layer by establishing a continuous depletion region between the buried channel and the interface and maintaining the potential of charge carriers in said first layer between said buried channel and said interface less than the potential of charge carriers in said substrate and said first layer outside said buried channel and said interface, whereby the isolated vertical charge coupling prevents any significant charge coupled from recombining with charges in the substrate and the first layer or being collected by neighboring cells of the array;

wherein first and second electrically conductive lines are connected, respectively, to said conductive layer and said buried channel;

said step of applying potentials including the steps of: generating a first level voltage and a second level voltage higher than said first level voltage to be applied to said first line;

generating a third level voltage and a fourth level voltage higher than said third level voltage to be applied to said second line;

in a non-destructive read mode, applying the second level voltage to said first line and the fourth level voltage to said second line causing variation in resistance of said buried channel, the second level and fourth level voltages relative to the substrate being large enough to establish a continuous depletion region between the buried channel and the interface and utilizing said resistance variation to determine stored data; and in the write mode, applying the first level voltage to said first line and the fourth level voltage to said second line, then applying said second level voltage to said first line and either one of said third and fourth level voltages to said second line, the first and second level voltages and the third and fourth level voltages relative to said substrate being large enough to establish a continuous depletion region between the buried channel and the interface to result in isolated vertical charge coupling of substantially all charge between said interface and said buried channel, and utilizing said charge transfer between said buried channel and said interface to write data.

7. A metal-insulator-semiconductor transistor comprising:

a substrate of a first conductivity type;

a buried channel of a second conductivity type formed in said substrate and terminating in the upper surface of said substrate;

a continuous first layer of substantially uniform thickness of semiconductive material of the first type of conductivity disposed on said substrate;

a first and second region of said second conductivity type formed in said first layer on opposite sides, respectively, of said buried channel and terminating in the surface of said first layer, said first and second regions, respectively, being isolated from said buried channel by regions of said first layer of said first conductivity type and forming a drain and a source of said transistor;

an insulator layer of substantially uniform composition and dielectric constant on the upper surface of said first layer extending between said first and second region;

a conductive layer deposited on said insulating layer, said conductive layer forming the gate electrode of said transistor and one plate of a storage capacitor which overlies said buried channel, an interface between said first layer and said insulating layer forming the other plate of said storage capacitor, the thickness and dielectric constant of said insulating layer being selected to provide a predetermined capacitive impedance of said storage capacitor;

said buried channel, said conductive layer, said substrate, said first region and said second region being connectable respectively to sources of external voltage.

8. A metal-insulator semiconductor transistor in accordance with claim 7 in which a tub-shaped channel stop region of said first conductivity type and of higher impurity concentration than said first layer, is formed in said first layer to define and circumscribe an active transistor area which terminates in the upper surface of said first layer.

9. A metal-insulator semiconductor transistor comprising:
- a substrate formed of a semiconductor material having a first conductivity type;
- a buried channel of a second conductivity type formed in said substrate and terminating in the upper surface of said substrate;
- a continuous first layer of substantially uniform thickness of semiconductive material of said first conductivity type disposed on said substrate and said buried channel;
- a first and second region of said second conductivity type formed in said first layer on opposite sides, respectively, of said buried channel and terminating in the surface of said first layer of said first conductivity type and forming a drain and a source of said transistor;
- an insulator layer of substantially uniform composition and dielectric constant on the upper surface of said first layer extending between said first and second region,
- a conductive layer deposited on said insulating layer, said conductive layer forming the gate electrode of said transistor and one plate of a storage capacitor which overlies said buried channel, an interface between said first layer and said insulating layer forming the other plate of said storage capacitor, the thickness and dielectric constant of said insulating layer being selected to provide a predetermined capacitive impedance of said storage capacitor;
- said buried channel, said conductive layer, said substrate, said first region and said second region being connectible respectively to sources of external voltage;
- wherein the thickness and impurity concentration profile of said first layer and the impurity concentration profile of said buried channel are selected to provide isolated vertical charge coupling of substantially all charge between said buried channel and said interface when selected potentials are applied to said transistor by said sources to establish a continuous depletion region between the buried channel and the interface, whereby isolated vertical charge coupling prevents any significant coupled charge from recombining with charges in the substrate and said first layer.

10. A metal-insulator semiconductor transistor comprising:
- a substrate formed of a semiconductor material having a first conductivity type;
- a buried channel of a second conductivity type formed in said substrate and terminating in the upper surface of said substrate;
- a continuous first layer of substantially uniform thickness of semiconductive material of said first conductivity type disposed on said substrate and said buried channel;
- a first and second region of said second conductivity type formed in said first layer on opposite sides, respectively, of said buried channel and terminating in the surface of said first layer, said first and second regions, respectively, being isolated from said buried channel by regions of said first layer of said first conductivity type and forming a drain and a source of said transistor;
- an insulating layer of substantially uniform composition and dielectric constant on the upper surface of said first layer extending between said first and second region;
- a conductive layer deposited on said insulating layer, said conductive layer forming the gate electrode of said transistor and one plate of a storage capacitor which overlies said buried channel, an interface between said first layer and said insulating layer forming the other plate of said storage capacitor, the thickness and dielectric constant of said insulating layer being selected to provide a predetermined capacitive impedance of said storage capacitor;
- said buried channel, said conductive layer, said substrate, said first region and said second region being connectable respectively to sources of external voltage,
- wherein the thickness and impurity concentration profile of said first layer and the impurity concentration profile of said buried channel are selected to provide a potential barrier under said interface and said first and second regions to reduce any interfering charge collection from said substrate and said first layer in response to selected potentials applied to said transistor by said voltage sources.

* * * * *